United States Patent
Dawson et al.

(10) Patent No.: US 8,922,227 B2
(45) Date of Patent: Dec. 30, 2014

(54) SYSTEMS AND METHODS FOR DETECTING SURFACE CHARGE

(75) Inventors: Chad S. Dawson, Queen Creek, AZ (US); Bernhard H. Grote, Phoenix, AZ (US); Woo Tae Park, Singapore (SG)

(73) Assignee: Freescale Semiconductor Inc., Austin, TX (US)

( * ) Notice: Subject to any disclaimer, the term of this patent is extended or adjusted under 35 U.S.C. 154(b) by 759 days.

(21) Appl. No.: 13/043,075

(22) Filed: Mar. 8, 2011

(65) Prior Publication Data
US 2012/0229153 A1  Sep. 13, 2012

(51) Int. Cl.
G01R 27/08 (2006.01)
G01R 29/24 (2006.01)

(52) U.S. Cl.
CPC ................. G01R 29/24 (2013.01)
USPC .......... 324/691; 324/750.03; 324/762.05; 324/459; 73/504.12; 73/754; 702/65

(58) Field of Classification Search
USPC ................................................ 324/691
See application file for complete search history.

(56) References Cited

U.S. PATENT DOCUMENTS

| | | | |
|---|---|---|---|
| 5,074,152 A | 12/1991 | Ellner et al. | |
| 5,231,301 A | 7/1993 | Peterson et al. | |
| 5,498,974 A * | 3/1996 | Verkuil et al. | 324/750.02 |
| 5,594,328 A * | 1/1997 | Lukaszek | 324/72 |
| 5,869,877 A * | 2/1999 | Patrick et al. | 257/429 |
| 6,741,445 B1 * | 5/2004 | Phan et al. | 361/230 |
| 6,787,804 B1 * | 9/2004 | Yang | 257/62 |
| 6,880,406 B2 * | 4/2005 | Yang | 73/754 |
| 7,219,554 B2 | 5/2007 | Fujimoto et al. | |
| 7,258,018 B2 * | 8/2007 | Kurtz et al. | 73/715 |
| 7,619,435 B2 * | 11/2009 | Zhao et al. | 324/762.05 |
| 2006/0255828 A1 * | 11/2006 | Furukawa | 324/771 |
| 2007/0159193 A1 * | 7/2007 | Min et al. | 324/754 |
| 2008/0028855 A1 * | 2/2008 | Kano et al. | 73/504.12 |
| 2009/0079409 A1 * | 3/2009 | Chang | 323/284 |
| 2009/0085600 A1 * | 4/2009 | Zhao et al. | 324/766 |
| 2009/0166557 A1 * | 7/2009 | Makino et al. | 250/442.11 |
| 2011/0037494 A1 * | 2/2011 | Hung et al. | 324/762.03 |
| 2012/0153962 A1 * | 6/2012 | Finch et al. | 324/456 |
| 2012/0179409 A1 * | 7/2012 | Montrose et al. | 702/117 |

OTHER PUBLICATIONS

Betzner, T., Charge Transfer to MEMS Pressure Sensors by Glow Discharge Plasmas, IEEE Journal of Microelectromechanical Systems, vol. 15, No. 5, Oct. 2006. pp. 1392-1397.
U.S. Appl. No. 12/949,356, filed Nov. 18, 2010.

* cited by examiner

*Primary Examiner* — Benjamin M Baldridge
(74) *Attorney, Agent, or Firm* — Ingrassia Fisher & Lorenz, P.C.

(57) ABSTRACT

Systems and methods are provided for detecting surface charge on a semiconductor substrate having a sensing arrangement formed thereon. An exemplary sensing system includes the semiconductor substrate having the sensing arrangement formed thereon, and a module coupled to the sensing arrangement. The module obtains a first voltage output from the sensing arrangement when a first voltage is applied to the semiconductor substrate, obtains a second voltage output from the sensing arrangement when a second voltage is applied to the semiconductor substrate, and detects electric charge on the surface of the semiconductor substrate based on a difference between the first voltage output and the second voltage output.

20 Claims, 2 Drawing Sheets

SYSTEMS AND METHODS FOR DETECTING SURFACE CHARGE

TECHNICAL FIELD

Embodiments of the subject matter described herein relate generally to electronic circuits, and more particularly, embodiments of the subject matter relate to systems and methods for detecting the presence of static electric charges on the surface of a semiconductor substrate.

BACKGROUND

Microelectromechanical systems (MEMS) are widely used in a variety of sensing applications. For example, a MEMS piezoresistive pressure sensor may be implemented on a semiconductor die to generate electrical signals indicative of the amount of pressure exerted on the semiconductor die (or a portion thereof). During fabrication, when static charges accumulate on the surface of the semiconductor die, resulting leakage currents may produce a shift in the electrical signals generated by the pressure sensor when the pressure sensor is initially calibrated. However, the static charge dissipates over time and produces corresponding shift in the electrical signals generated by the pressure sensor that may cause the pressure sensor to become out of calibration.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Technologies and concepts discussed herein relate to sensing devices that utilize a sensing arrangement formed on a semiconductor substrate. In this regard, the sensing arrangement generates an output signal indicative of a sensed quantity, such as the pressure or force applied to or otherwise exerted upon the semiconductor substrate. In an exemplary embodiment, an initial voltage is applied to the semiconductor substrate, and an initial measured value for the output signal is obtained while the initial voltage is applied to the semiconductor substrate. After obtaining the initial measured output signal value, the voltage applied to the semiconductor substrate is adjusted, and the output signal is monitored to determine whether the output signal changes from the initial measured output signal value by more than a threshold amount chosen to be indicative of a surface charge condition. As used herein, a surface charge condition should be understood as referring to a sufficiently large enough accumulation of static electric charges on the surface of the semiconductor substrate that is likely to impact the calibration of the sensing arrangement or otherwise cause the sensing arrangement to drift out of its intended calibration tolerance. For example, in one embodiment, the threshold amount is chosen to be indicative of a leakage current caused by accumulated static electric charges. When a difference between a subsequent measured output signal value and the initial measured output signal value exceeds the threshold amount, a surface charge condition is detected or otherwise identified, and one or more remedial actions are taken before calibrating the sensing arrangement. In the absence of a surface charge condition, the sensing arrangement may be calibrated in a conventional manner without concern for the output signal from the sensing arrangement drifting out of calibration due to dissipation of static electric charges that may otherwise be present during calibration.

Figure 1:
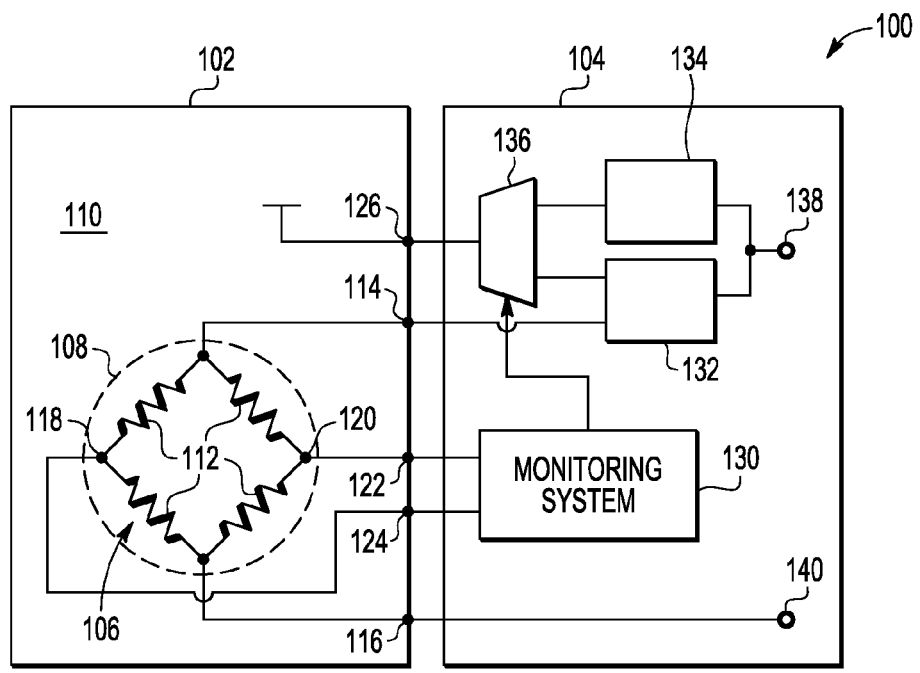
FIG. 1 is a block diagram of a pressure sensing system in accordance with one embodiment of the invention.

FIG. 1 depicts an exemplary embodiment of a pressure sensing system 100 that includes, without limitation, a pressure sensing device 102 and a control module 104. The elements of the pressure sensing system 100 are suitably configured to sense or otherwise determine the magnitude of the pressure (or force) applied to the pressure sensing device 102, as described in greater detail below. It should be understood that FIG. 1 is a simplified representation of a pressure sensing system 100 for purposes of explanation and ease of description, and that practical embodiments may include other devices and components to provide additional functions and features, and/or the pressure sensing system 100 may be part of a much larger electrical system, as will be understood.

In an exemplary embodiment, the pressure sensing device 102 is realized as a microelectromechanical system (MEMS) pressure sensor that includes a pressure sensing arrangement 106 formed on a diaphragm region 108 of a semiconductor substrate 110. In this regard, the diaphragm region 108 refers to a region of the semiconductor substrate 110 that is capable of being displaced, deflected, or otherwise moved with respect to the surrounding semiconductor substrate 110. The pressure sensing arrangement 106 is configured to generate or otherwise produce indicia of a sensed quantity, wherein the indicia are influenced by the amount of displacement or deflection of the diaphragm region 108. In an exemplary embodiment, the pressure sensing arrangement 106 generates or otherwise produces electrical output signals that are indicative of the amount of pressure (or force) applied to the diaphragm region 108 of the semiconductor substrate 110. In an exemplary embodiment, the pressure sensing arrangement 106 includes four piezoresistive elements 112 configured in a Wheatstone bridge between a supply reference voltage provided at a supply voltage terminal 114 and a ground reference voltage at a ground voltage terminal 116. The displacement or deflection of the diaphragm region 108 influences the resistances of the piezoresistive elements 112 to produce a corresponding change in the voltage difference between a pair of output nodes 118, 120 of the Wheatstone bridge. The output nodes 118, 120 are coupled to corresponding output terminals 122, 124 of the pressure sensing device 102 to provide an output voltage signal that is indicative of the pressure (or force) applied to the diaphragm region 108 of the pressure sensing device 102. The pressure sensing device 102 also includes a substrate voltage terminal 126 that is electrically connected to the body of the semiconductor substrate 110 to bias the voltage of the semiconductor substrate 110 to the voltage at the substrate voltage terminal 126. As described in greater detail below in the context of FIG. 2, in an exemplary embodiment, each terminal 114, 116, 122, 124, 126 is realized as a conductive contact pad formed on the semiconductor substrate 110 that may be electrically connected to the control module 104 in a conventional manner.

In the illustrated embodiment, the control module 104 is realized as an application specific integrated circuit (ASIC) that is formed on a semiconductor substrate (or die) that is separate from the semiconductor substrate 110 of the pressure sensing device 102, however, in alternative embodiments, the control module 104 and the pressure sensing device 102 may be integrated on the same semiconductor substrate. In an exemplary embodiment, the control module 104 includes a monitoring system 130, a first voltage regulating element 132, a second voltage regulating element 134, and selection circuitry 136. Inputs of the control module 104 provided to monitoring system 130 are coupled to the output terminals 122, 124 of the pressure sensing device 102 to receive the indicia generated or otherwise produced by the pressure sensing device 102 that are indicative of a sensed quantity, in this case, output voltage signals from the pressure sensing arrangement 106 indicative of the pressure (or force) applied to the diaphragm region 108. In this regard, the monitoring system 130 generally represents the circuitry, hardware, processing logic and/or other components of the control module 104 that are configured to convert the output voltage signal (e.g., the voltage difference between nodes 118, 120) to a corresponding pressure (or force) metric and perform additional tasks and/or functions associated with the operation of the pressure sensing system 100 described in greater detail below. In this regard, depending on the embodiment, the monitoring system 130 may be implemented as or otherwise include one or more of a general purpose processor, a microprocessor, a microcontroller, a content addressable memory, a digital signal processor, a field programmable gate array, any suitable programmable logic device, discrete gate or transistor logic, discrete hardware components, or any combination thereof, designed to perform the functions described herein. In this regard, the steps of any method or algorithm described in connection with the embodiments disclosed herein may be embodied directly in hardware, in firmware, in a software module executed by the monitoring system 130, or in any practical combination thereof.

In an exemplary embodiment, each voltage regulating element 132, 134 is configured to provide a regulated output voltage at its output. In the illustrated embodiment, the voltage regulating elements 132, 134 are implemented or otherwise integrated with the control module 104, wherein the input of each voltage regulating element 132, 134 is coupled a node 138 of the control module 104 that is configured to receive a supply voltage for the control module 104 and/or pressure sensing system 100. In this regard, each voltage regulating element 132, 134 is configured to provide a regulated output voltage at its output that is a fraction of the supply voltage at node 138. Each voltage regulating element 132, 134 may be realized as a voltage regulator, a resistor ladder (or voltage ladder), or another element capable of providing a regulated output voltage. It should be noted that although FIG. 1 depicts the voltage regulating elements 132, 134 being integrated with the control module 104, in some alternate embodiments, the voltage regulating elements 132, 134 may be separate from and/or external to the control module 104.

In the illustrated embodiment, the first voltage regulating element 132 is configured to provide a desired supply reference voltage for the pressure sensing arrangement 106 and/or pressure sensing device 102 at its output, and the second voltage regulating element 134 is configured to provide a different voltage at its output. In this regard, the output of the first voltage regulating element 132 is coupled to the supply voltage terminal 114 of the pressure sensing device 102, and the ground voltage terminal 116 of the pressure sensing device 102 is coupled a node 140 of the control module 104 that is configured to receive a ground reference voltage for the control module 104 and/or pressure sensing system 100.

In an exemplary embodiment, the second voltage regulating element 134 is configured to provide a test voltage used to detect the presence of static electric charges on the surface of the semiconductor substrate 110, as described in greater detail below. As illustrated in FIG. 1, the output of each voltage regulating element 132, 134 is provided to a respective input of the selection circuitry 136. The output of the selection circuitry 136 is coupled to the substrate voltage terminal 126 of the pressure sensing device 102 to provide a desired bias voltage (or back gate voltage) to the body of the semiconductor substrate 110, as described in greater detail below. It should be noted that in some embodiments, the voltage regulating elements 132, 134 and the bias selection circuitry 136 may be integrated and implemented as a single voltage regulating element capable of generating or otherwise providing an output voltage to the substrate voltage terminal 126 selected from a plurality of possible voltages, wherein the output voltage provided by the voltage regulating element is selected or otherwise controlled by the monitoring system 130. In such embodiments, multiple voltage regulating elements and/or selection circuitry 136 need not be present.

As described in greater detail below in the context of FIG. 4, in an exemplary embodiment, the monitoring system 130 is coupled to the selection input of the selection circuitry 136, and the monitoring system 130 is configured to detect static electric charge on the surface of the semiconductor substrate 110 by operating the selection circuitry 136 to apply or otherwise provide the supply reference voltage from the first voltage regulating element 132 to the semiconductor substrate 110, obtaining an initial measured value for the output voltage from the pressure sensing arrangement 106 (i.e., the voltage between output nodes 118, 120) while the supply reference voltage from the first voltage regulating element 132 is applied to the semiconductor substrate 110, operating the selection circuitry 136 to apply or otherwise provide the test voltage from the second voltage regulating element 134 to the semiconductor substrate 110, and obtaining a second measured value for the output voltage from the pressure sensing arrangement 106 while the test voltage from the second voltage regulating element 134 is applied to the semiconductor substrate 110. The monitoring system 130 detects a surface charge condition when the difference between the initial measured output voltage value and the second measured output voltage value exceeds a threshold amount, and in response to detecting the surface charge condition, the monitoring system 130 may generate an interrupt signal or otherwise indicate the surface charge condition to another component of the pressure sensing system 100, and/or the monitoring system 130 otherwise initialize one or more remedial actions instead of calibrating the pressure sensing arrangement 106 and/or pressure sensing device 102. In the absence of a surface charge condition, the monitoring system 130 may execute one or more calibration procedures to determine a conversion factor for converting the measured output voltage from the pressure sensing arrangement 106 (i.e., the voltage between nodes 118, 120) into a value (or quantity) of a pressure (or force) metric (e.g., pascals, newtons, or the like).

Figure 2:
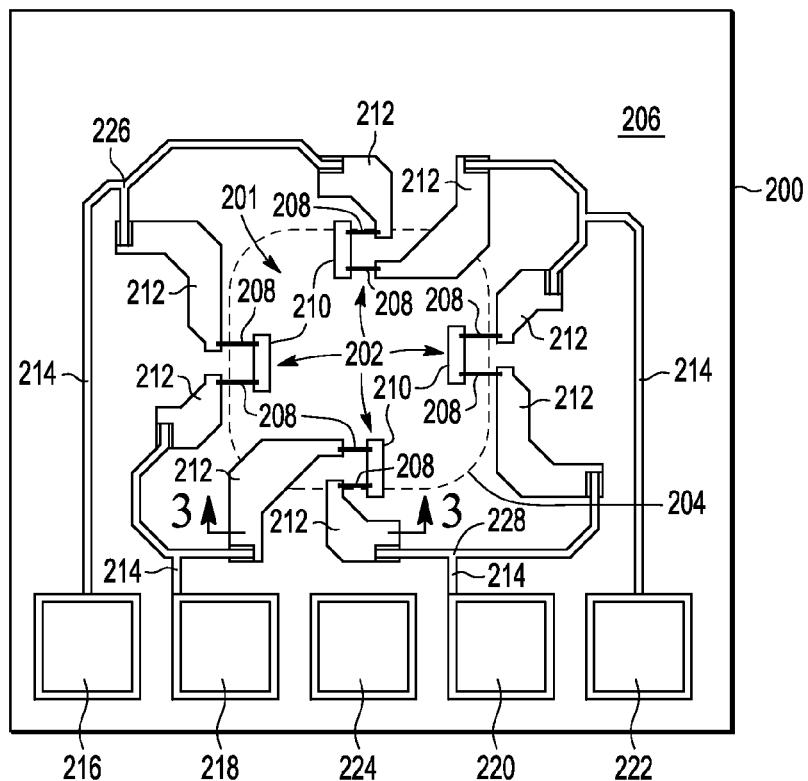
FIG. 2 is a top view of a pressure sensing device suitable for use in the pressure sensing system of FIG. 1 in accordance with one embodiment of the invention.

FIG. 2 depicts an exemplary embodiment of a pressure sensing device 200 suitable for use as the pressure sensing device 102 in the pressure sensing system 100 of FIG. 1. The pressure sensing device 200 includes a pressure sensing arrangement 201 comprised of a plurality of piezoresistive elements 202 formed on a diaphragm region 204 of a semiconductor substrate 206. As described above, the diaphragm region 204 is a region of the semiconductor substrate 206 that is capable of being displaced, deflected, or otherwise moved with respect to the surrounding semiconductor substrate 206. In this regard, the periphery of the semiconductor substrate 206 may be supported or otherwise maintained in a fixed position, while the diaphragm region 204 moves with respect to the remaining portion of the semiconductor substrate 206 in response to pressure (or force) applied to the pressure sensing device 200 perpendicular to the plane of the semiconductor substrate 206. In accordance with one embodiment, the diaphragm region 204 comprises a thin region of the semiconductor substrate 206 relative to the remaining portion of the semiconductor substrate 206 that surrounds the diaphragm region 204.

In an exemplary embodiment, each piezoresistive element 202 is realized as a pair of resistive regions 208 formed on the diaphragm region 204 of the semiconductor substrate 206 that are interconnected by an interconnect region 210 formed on the diaphragm region 204 between a respective pair of resistive regions 208. In this regard, the regions 208, 210 are realized by doping the semiconductor substrate 206 with ions of a conductivity-determining impurity type that is opposite the conductivity-type of the semiconductor substrate 206. For example, in accordance with one embodiment, the semiconductor substrate 206 is doped with N-type ions, such as phosphorous ions or arsenic ions, and the regions 208, 210 are formed by doping the respective areas of the diaphragm region 204 with P-type ions, such as boron ions. The resistive regions 208 have a relatively low dopant concentration, such that the resistance of the resistive regions 208 is more sensitive to or otherwise influenced by the displacement of the diaphragm region 204. The interconnect regions 210 have a dopant concentration greater than the dopant concentration of the resistive regions 208, such that displacement of the diaphragm region 204 has a negligible effect on the resistance of the interconnect regions 210. In the illustrated embodiment, each resistive region 208 contacts a conductive region 212 of the semiconductor substrate 206 that electrically connects the resistive region 208 to a respective conductive trace 214 formed on the semiconductor substrate 206. In this regard, the conductive regions 212 are realized as doped regions of the semiconductor substrate 206 having the same conductivity-type as the doped regions 208, 210 of the piezoresistive elements 202. The conductive regions 212 have a relatively high dopant concentration (e.g., a dopant concentration greater than the dopant concentration of the resistive regions 208) to provide a low impedance interconnect between the conductive traces 214 and the piezoresistive elements 202.

As illustrated, the conductive traces 214 electrically connect the piezoresistive elements 202 to conductive contact pads 216, 218, 220, 222 formed on the semiconductor substrate 206 to configure the piezoresistive elements 202 in a Wheatstone bridge, as described above in the context of FIG. 1. In this regard, the conductive traces 214 configure the piezoresistive elements 202 between a supply reference voltage provided at a supply voltage pad 222 (e.g., supply voltage terminal 114) and a ground reference voltage provided at a ground voltage pad 218 (e.g., a ground voltage terminal 116) such that displacement or deflection of the diaphragm region 204 influences the resistances of the piezoresistive elements 202 to produce a corresponding change in the voltage difference between a pair of output nodes 226, 228 of the Wheatstone bridge. The output nodes 226, 228 are connected to corresponding output pads 216, 220 (e.g., output terminals 122, 124) to provide an output voltage signal that is indicative of the pressure (or force) applied to the diaphragm region 204 of the pressure sensing device 200.

As illustrated, the pressure sensing device 200 also includes a substrate pad 224 (e.g., substrate voltage terminal 126) that is electrically connected to the semiconductor substrate 206 to bias the voltage of the semiconductor substrate 206 to the voltage at the substrate pad 224. For example, the substrate pad 224 may be formed overlying a doped region formed in the semiconductor substrate 206 having the same conductivity type as the semiconductor substrate 206 (e.g., a doped N-type region) to provide a contact from the substrate pad 224 to the body of the semiconductor substrate 206. As illustrated, the substrate pad 224 is located outside of the diaphragm region 204 and does not contact the other pads 216, 218, 220, 222, the piezoresistive elements 202, or their corresponding conductive regions 212 and conductive traces 214, such that the substrate pad 224 is electrically isolated from the pads 216, 218, 220, 222 and the piezoresistive elements 202. In an exemplary embodiment, there are no conductive elements formed on the surface of the semiconductor substrate 206 that contact or otherwise electrically connect to the substrate pad 224.

Figure 3:
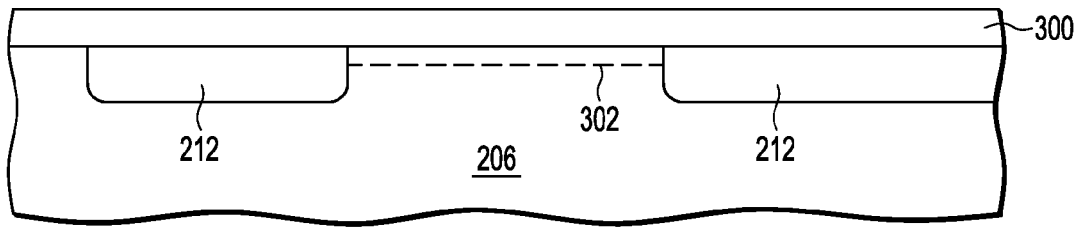
FIG. 3 is a cross-sectional view of the pressure sensing device of FIG. 2 along the line 3-3 in accordance with one embodiment of the invention.

Referring now to FIG. 3, and with continued reference to FIG. 1 and FIG. 2, in an exemplary embodiment, a layer 300 of a dielectric material, such as an oxide material or a nitride material, is formed overlying the semiconductor substrate 206 to prevent electrical connections to the semiconductor substrate 206, piezoresistive elements 202, conductive regions 212, and/or conductive traces 214 except for those provided by terminals 216, 218, 220, 222, 224. In this regard, if static electric charges accumulate on the surface of the pressure sensing device 200 (i.e., on the dielectric layer 300), the resulting voltage may turn on the parasitic transistor formed by adjacent conductive regions 212 having a conductivity type opposite the intervening portion of semiconductor substrate 206 and create an inversion channel 302 that results in leakage current flowing between two adjacent conductive regions 212. As the static electric charges dissipate over time, the inversion channel 302 is eventually turned off. In this manner, the static electric charges on the surface of the pressure sensing device 102, 200 may increase the current that flows through the piezoresistive elements 112, 202, and thereby, influences the calibration of the pressure sensing arrangement 106, 201.

Figure 4:
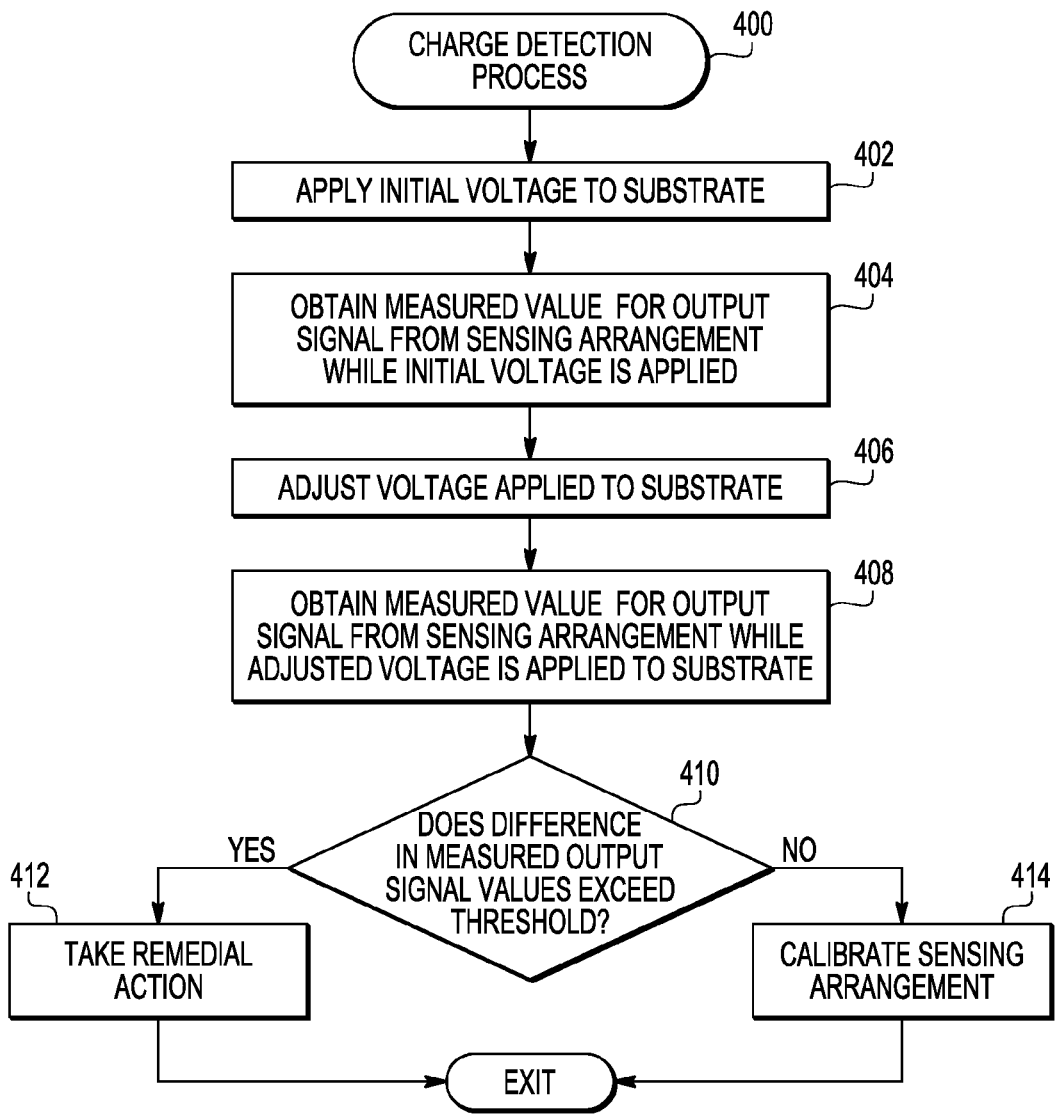
FIG. 4 is a flow diagram of a charge detection process suitable for use with the pressure sensing system of FIG. 1 in accordance with one embodiment of the invention.

Referring now to FIG. 4, in an exemplary embodiment, a pressure sensing system is configured to perform a charge detection process 400 and additional tasks, functions, and/or operations as described below. The various tasks may be performed by software, hardware, firmware, or any combination thereof. For illustrative purposes, the following description may refer to elements mentioned above in connection with FIGS. 1-3. In practice, the tasks, functions, and operations may be performed by different elements of the described system, such as the pressure sensing device 102, 200, the pressure sensing arrangement 106, the piezoresistive elements 112, 202, the monitoring system 130, the voltage regulating elements 132, 134, and/or the bias selection circuitry 136. It should be appreciated any number of additional or alternative tasks may be included, and may be incorporated into a more comprehensive procedure or process having additional functionality not described in detail herein.

Referring now to FIG. 4, and with continued reference to FIGS. 1-3, a charge detection process 400 may be performed to detect or otherwise identify the presence of static electric charges on the surface of a pressure sensing device 102, 200 that is likely to influence calibration of the pressure sensing device 102, 200 or otherwise interfere with the ability of the piezoresistive elements 112, 202 to accurately resolve a force or pressure applied to the pressure sensing device 102, 200. In an exemplary embodiment, ambient pressure is the only pressure (or force) applied to the pressure sensing device 102, 200 during execution of the charge detection process 400. In alternative embodiments, a fixed or constant reference pressure (or force) may be applied to the pressure sensing device 102, 200 during execution of the charge detection process 400.

In an exemplary embodiment, the charge detection process 400 begins by applying an initial voltage to the semiconductor substrate of the pressure sensing device and obtaining an initial measured value for the output signal from the sensing arrangement on the pressure sensing device while the initial substrate voltage is supplied (tasks 402, 404). In this regard, the monitoring system 130 operates the bias selection circuitry 136 to electrically couple the output of the first voltage regulating element 132 to the substrate voltage terminal 126, 224 of the pressure sensing device 102, 200 to provide the voltage at the output of the first voltage regulating element 132 to the body of the semiconductor substrate 110, 206. After operating the bias selection circuitry 136 to provide the voltage from the first voltage regulating element 132 to the semiconductor substrate 110, 206, the monitoring system 130 obtains or otherwise measures the voltage between a first output node 118, 226 and a second output node 120, 228 of the pressure sensing arrangement 106, 201, that is, the voltage difference between the first output terminal 122, 220 and the second output terminal 124, 216 of the pressure sensing device 102, 200, while the voltage from the first voltage regulating element 132 is applied to the semiconductor substrate 110, 206. In this regard, the measured voltage is indicative of the resistances of the piezoresistive elements 112, 202 while the ambient pressure (or fixed reference pressure) is applied to the diaphragm region 108, 204. The monitoring system 130 stores or otherwise maintains the measured voltage across output nodes of the pressure sensing arrangement 106, 201 as the initial measured output voltage from the pressure sensing arrangement 106, 201.

In an exemplary embodiment, the charge detection process 400 continues by adjusting the voltage applied to the semiconductor substrate, monitoring the output signal from the sensing arrangement while the adjusted substrate voltage is applied, and detecting a surface charge condition when the measured value for the output signal changes from the initial measured output signal value by more than a threshold amount (tasks 406, 408, 410). In this regard, the monitoring system 130 operates the bias selection circuitry 136 to change or otherwise adjust the voltage applied to the body of the semiconductor substrate 110, 206 and obtains a measured value for the voltage across the piezoresistive elements 112, 202 of the pressure sensing arrangement 106, 201 while the adjusted substrate voltage is supplied. In the illustrated embodiment of FIG. 1, the monitoring system 130 operates the bias selection circuitry 136 to electrically couple the output of the second voltage regulating element 134 to the substrate voltage terminal 126, 224 of the pressure sensing device 102, 200 to provide the voltage at the output of the second voltage regulating element 134 to the semiconductor substrate 110, 206. While the test voltage from the output of the second voltage regulating element 134 is applied to the semiconductor substrate 110, 206, the monitoring system 130 obtains or otherwise measures the output voltage from the pressure sensing arrangement 106, 201 and stores or otherwise maintains the measured output voltage value from the pressure sensing arrangement 106, 201 in association with the adjusted substrate voltage.

After obtaining a measured output voltage value when the adjusted substrate voltage is applied, the monitoring system 130 continues by determining whether the difference between the measured output voltage value and the initial measured output voltage value is greater than or otherwise exceeds a threshold amount. As described above, the subsequent measured output voltage value is indicative of the resistances of the piezoresistive elements 112, 202, and thus, in the absence of static electric charges should be substantially equal to the initial measured output voltage because the same ambient pressure (or fixed reference pressure) is applied to the diaphragm region 108, 204 as the substrate voltage is adjusted during execution of the charge detection process 400. However, as described above in the context of FIG. 3, accumulated static electric charges on the surface of the pressure sensing device 102, 200 may create an inversion channel through portions of the semiconductor substrate 110, 206. In this regard, varying the voltage of the semiconductor substrate 110, 206 varies the back gate (or body) voltage of the parasitic transistors formed by two adjacent conductive regions 212 separated by a portion of the semiconductor substrate 206 having the opposite conductivity type. Thus, if static electric charges are present on the surface of the pressure sensing device 102, 200, varying the voltage of the semiconductor substrate 110, 206 will also vary the leakage current through the parasitic transistors, which in turn, varies the total current that flows through the piezoresistive elements 112, 202 of the pressure sensing arrangement 106, 201 between the supply voltage terminal 114, 222 and the ground voltage terminal 116, 218. In this manner, the measured output voltage value between the first output voltage terminal 122, 216 and the second output voltage terminal 124, 220 will change in response to the leakage current, thereby indicating a change in the resistances of the piezoresistive elements 112, 202 and the pressure applied to the diaphragm region 108, 204, even though the pressure applied to the diaphragm region 108, 204 is unchanged. In the absence of static electric charges on the surface of the pressure sensing device 102, 200, the total current that flows through the piezoresistive elements 112, 202 of the pressure sensing arrangement 106 between the supply voltage terminal 114, 222 and the ground voltage terminal 116, 218 remains substantially constant while varying the voltage of the semiconductor substrate 110, 206. Accordingly, the threshold amount corresponds to a voltage difference that is indicative of static electric charges on the surface of the semiconductor substrate 110, 206 causing leakage currents that would cause the output voltage from the pressure sensing arrangement 106, 201 to change in response to a change in the substrate voltage without changing the pressure (or force) applied to the pressure sensing device 102, 200 and/or diaphragm region 108, 204. Thus, when a subsequent measured output voltage value obtained from the pressure sensing arrangement 106, 201 while an adjusted substrate voltage is applied changes by more than the threshold amount relative to the initial measured output voltage value, the monitoring system 130 detects a surface charge condition or otherwise identifies the presence of static electric charges on the surface of the pressure sensing device 102, 200.

In response to detecting a surface charge condition, that is, a change in the measured output signal from the sensing arrangement that exceeds the threshold amount when the voltage applied to the substrate is adjusted, the charge detection process 400 continues by taking one or more remedial actions (task 412). For example, the monitoring system 130 may generate an interrupt signal or otherwise indicate the presence of the static electric charges on the surface of the pressure sensing device 102, 200 to another system or component external to the pressure sensing system 100. In this manner, the monitoring system 130 may indicate that the pressure sensing device 102, 200 should be discarded or replaced. In some embodiments, the monitoring system 130 may be configured to wait for a fixed time period before re-executing the charge detection process 400 to determine whether the surface charges have dissipated. If the monitoring system 130 detects static electric charges on the surface of the pressure sensing device 102, 200 after waiting for a first time period, the monitoring system 130 may wait for another time period before re-executing the charge detection process 400. After waiting and re-executing the charge detection process 400 for a certain number of times and still detecting static electric charges on the pressure sensing device 102, 200, the monitoring system 130 may then generate an interrupt signal or otherwise indicate that the pressure sensing device 102, 200 should be discarded or replaced.

In response to failing to detect a surface charge condition (i.e., when the difference between measured output signal from the sensing arrangement is less the threshold amount when the voltage applied to the semiconductor substrate is adjusted), in an exemplary embodiment, the charge detection process 400 continues by calibrating the sensing arrangement in a conventional manner (task 414). In this regard, the monitoring system 130 may execute one or more calibration procedures to determine a conversion factor for precisely and accurately converting subsequently measured output voltages from the pressure sensing arrangement 106, 201 into corresponding pressure (or force) metric values (e.g., a conversion factor for converting volts to pascals, a conversion factor for converting volts to newtons, etc.). For example, the monitoring system 130 may apply the desired bias voltage to the semiconductor substrate 110, 206 (e.g., the voltage output from the first voltage regulating element 132), obtain the measured voltage output from the pressure sensing arrangement 106, 201 while a known amount of pressure is applied to the pressure sensing device 102, 200, and determine a factor for converting output voltages from the pressure sensing arrangement 106, 201 to a corresponding pressure metric value based on the measured voltage output and the known amount of pressure applied to the pressure sensing device 102, 200. After calibrating the pressure sensing device 102, 200, the pressure sensing system 100 may be used to accurately and reliably measure a pressure (or force) applied to the pressure sensing device 102, 200 that displaces or deflects the diaphragm region 108, 204.

To briefly summarize, one advantage of the systems described above is that static electric charges on the surface on a semiconductor substrate may be identified before calibrating a sensing arrangement formed thereon. As a result, the sensing arrangement may be calibrated and utilized without concern for subsequent output drift that may otherwise be caused by dissipation of static electric charges that were present on the surface of the semiconductor substrate when the sensing arrangement was initially calibrated. It should be appreciated that although the subject matter is described herein in the context of the pressure sensing system 100 and/or charge detection process 400 utilizing only two different substrate voltages, the subject matter is not intended to be limited to any particular number of applied substrate voltages utilized to detect a surface charge condition. For example, in practice, the pressure sensing system 100 and/or charge detection process 400 may be modified to sequentially apply a plurality of substrate voltages to the semiconductor substrate 110, 206 at different times by sweeping the voltage applied to the semiconductor substrate 110, 206 from the initially applied voltage to a greater or lesser voltage through a range of voltage values, and the output signal from the pressure sensing arrangement 106, 201 may be monitored at the different times while the different substrate voltages are being applied for any deviation from the initial measured output signal value exceeding a threshold amount, as described above.

For the sake of brevity, conventional techniques related to MEMS devices, pressure (or force) sensing, piezoresistive pressure sensors and/or related calibration methods, voltage sensing, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

In conclusion, systems, devices, and methods configured in accordance with example embodiments of the invention relate to:

In an exemplary embodiment, an apparatus for a sensing system is provided. The sensing system includes a semiconductor substrate having a sensing arrangement formed thereon and a module including at least one input coupled to the sensing arrangement. The module obtains a first indication of a sensed quantity, such as a first output voltage signal indicative of a sensed pressure, from the sensing arrangement when a first voltage is applied to the semiconductor substrate, obtains a second indication, such as a second output voltage signal, from the sensing arrangement when a second voltage is applied to the semiconductor substrate, and detects an electric charge on a surface of the semiconductor substrate when a difference between the first indication and the second indication is greater than a threshold amount. The threshold amount corresponds to a voltage difference that is indicative of a leakage current caused by the electric charge on the surface of the semiconductor substrate. In one embodiment, the module includes a first voltage regulating element to provide the first voltage, a second voltage regulating element to provide the second voltage, and selection circuitry coupled to the first voltage regulating element and the second voltage regulating element. The selection circuitry has an output coupled to the semiconductor substrate, wherein the module controls the selection circuitry to apply the first voltage from the first voltage regulating element to the semiconductor substrate and the second voltage from the second voltage regulating element to the semiconductor substrate. In one embodiment, the output of the selection circuitry is coupled to a substrate pad on the semiconductor substrate for biasing a body of the semiconductor substrate. In accordance with one or more embodiments, the sensing arrangement comprises a plurality of piezoresistive elements formed on a diaphragm region of the semiconductor substrate. In one embodiment, the plurality of piezoresistive elements are arranged as a Wheatstone bridge having a pair of output nodes, the first indication is a first output voltage between the pair of output nodes when the first voltage is applied to the semiconductor substrate, the second indication is a second output voltage between the pair of output nodes when the second voltage is applied to the semiconductor substrate, and the electric charge on the surface of the semiconductor substrate is detected by the module when the difference between the first output voltage and the second output voltage is greater than the threshold amount. In one embodiment, the sensing system includes a substrate pad on the semiconductor substrate for biasing a body of the semiconductor substrate, wherein the module includes an output coupled to the substrate pad to apply the first voltage and the second voltage to the body of the semiconductor substrate. In yet another embodiment, the semiconductor substrate has a first conductivity-type, the substrate pad is formed overlying a first doped region formed in the semiconductor substrate having the first conductivity-type, and each piezoresistive element comprises one or more doped regions having a second conductivity-type formed on the diaphragm region. In one embodiment, module indicates presence of the electric charge on the surface of the semiconductor substrate in response to detecting the electric charge on the surface of the semiconductor substrate. In another embodiment, the module generates an interrupt signal in response to detecting the electric charge on the surface of the semiconductor substrate.

In another embodiment, a method is provided for operating a sensing device including a sensing arrangement formed on a semiconductor substrate. The method involves applying a first voltage to the semiconductor substrate, obtaining a first output from the sensing arrangement while the first voltage is applied to the semiconductor substrate, applying a second voltage different from the first voltage to the semiconductor substrate, obtaining a second output from the sensing arrangement while the second voltage is applied to the semiconductor substrate, and identifying a charge on a surface of the semiconductor substrate when a difference between the first output and the second output is greater than a threshold amount. In one embodiment, the method involves calibrating the sensing arrangement when the difference between the first output and the second output is less than the threshold amount. In another embodiment, the method involves taking remedial action in response to identifying the charge on the surface of the semiconductor substrate. In yet another embodiment, the method involves generating an interrupt signal in response to identifying the charge on the surface of the semiconductor substrate. In accordance with one or more embodiments, the sensing arrangement comprises a plurality of piezoresistive elements formed on the semiconductor substrate, wherein obtaining the first output comprises obtaining a first output voltage from the plurality of piezoresistive elements, and obtaining the second output comprises obtaining a second output voltage from the plurality of piezoresistive elements. In a further embodiment, the method involves calibrating the sensing arrangement when the difference between the first output voltage and the second output voltage is less than the threshold amount. In one embodiment, calibrating the sensing arrangement comprises applying a bias voltage to the semiconductor substrate, obtaining a third output voltage from the plurality of piezoresistive elements while the bias voltage is applied to the semiconductor substrate, and determining a factor for converting a subsequent output voltage from the plurality of piezoresistive elements to a corresponding sensed metric value based on the third output voltage.

In yet another exemplary embodiment, a method is provided for operating a sensing device that includes a sensing arrangement formed on a semiconductor substrate. The method involves applying a plurality of substrate voltages to the semiconductor substrate, with each substrate voltage of the plurality of substrate voltages being applied at a different time. A respective indication from the sensing arrangement is obtained for each substrate voltage of the plurality of substrate voltages while the respective substrate voltage is applied to obtain a plurality of indicia. The method continues by detecting a surface charge condition based upon a difference among the plurality of indicia. In one embodiment, applying the plurality of substrate voltages involves applying an initial substrate voltage to the semiconductor substrate, an initial output voltage being obtained from the sensing arrangement while the initial substrate voltage is applied to the semiconductor substrate, and applying a second substrate voltage to the semiconductor substrate, a second output voltage being obtained from the sensing arrangement while the second substrate voltage is applied to the semiconductor substrate. The detecting the surface charge condition involves identifying when a difference between the second output voltage and the initial output voltage exceeds a threshold amount. In another embodiment, the sensing arrangement includes a plurality of piezoresistive elements formed on a diaphragm region of the semiconductor substrate, the plurality of piezoresistive elements generating a voltage output indicative of pressure applied to the sensing device, wherein the method further involves obtaining an initial measured voltage output from the plurality of piezoresistive elements when the a first substrate voltage of the plurality of substrate voltages is applied to the semiconductor substrate, and obtaining a second measured voltage output from the plurality of piezoresistive elements when a second substrate voltage of the plurality of substrate voltages is applied to the semiconductor substrate. The surface charge condition is detected when a difference between the second measured voltage output and the initial measured voltage output exceeds a threshold amount.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A sensing system comprising:
a semiconductor substrate having a sensing arrangement formed thereon; and
a module including at least one input coupled to an output of the sensing arrangement to obtain a first signal indicative of a sensed quantity from the output of the sensing arrangement when a first substrate voltage is applied to a body of the semiconductor substrate, obtain a second signal indicative of the sensed quantity from the output of the sensing arrangement when a second substrate voltage is applied to the body of the semiconductor substrate, and detect an electric charge on a surface of the semiconductor substrate based on a difference between the first signal and the second signal that is greater than a threshold amount.

2. The sensing system of claim 1, wherein the threshold amount corresponds to a voltage difference that is indicative of a leakage current caused by the electric charge on the surface of the semiconductor substrate, the electric charge being detected when the difference is greater than the threshold amount.

3. The sensing system of claim 1, wherein the module further comprises:
a first voltage regulating element to provide the first substrate voltage;
a second voltage regulating element to provide the second substrate voltage; and
selection circuitry coupled to the first voltage regulating element and the second voltage regulating element, the selection circuitry having an output coupled to the semiconductor substrate, wherein the module controls the selection circuitry to apply the first substrate voltage from the first voltage regulating element to the body of the semiconductor substrate and the second substrate voltage from the second voltage regulating element to the body of the semiconductor substrate.

4. The sensing system of claim 3, wherein the output of the selection circuitry is coupled to a substrate pad on the semiconductor substrate for biasing the body of the semiconductor substrate.

5. The sensing system of claim 1, wherein the sensing arrangement comprises a plurality of piezoresistive elements formed on a diaphragm region of the semiconductor substrate.

6. The sensing system of claim 5, wherein:
the plurality of piezoresistive elements are arranged as a Wheatstone bridge having a pair of output nodes;
the first signal is a first output voltage from the pair of output nodes when the first substrate voltage is applied to the body of the semiconductor substrate;
the second signal is a second output voltage from the pair of output nodes when the second substrate voltage is applied to the body of the semiconductor substrate; and
the electric charge on the surface of the semiconductor substrate is detected by the module when the difference between the first output voltage and the second output voltage is greater than the threshold amount.

7. The sensing system of claim 6, further comprising a substrate pad on the semiconductor substrate for biasing the body of the semiconductor substrate, wherein the module includes an output coupled to the substrate pad to apply the first substrate voltage and the second substrate voltage to the body of the semiconductor substrate.

8. The sensing system of claim 5, further comprising a substrate pad on the semiconductor substrate for biasing the body of the semiconductor substrate, wherein:
the semiconductor substrate has a first conductivity-type;
the substrate pad is formed overlying a first doped region formed in the semiconductor substrate having the first conductivity-type; and
each piezoresistive element comprises one or more doped regions having a second conductivity-type formed on the diaphragm region.

9. The sensing system of claim 1, wherein the module indicates presence of the electric charge on the surface of the semiconductor substrate in response to detecting the electric charge on the surface of the semiconductor substrate.

10. The sensing system of claim 1, wherein the module generates an interrupt signal in response to detecting the electric charge on the surface of the semiconductor substrate.

11. A method for operating a sensing device including a sensing arrangement formed on a semiconductor substrate, the method comprising:
applying a first substrate voltage to a body of the semiconductor substrate;
obtaining a first output indicative of a sensed quantity from the sensing arrangement while the first substrate voltage is applied to the body of the semiconductor substrate;
applying a second substrate voltage to the semiconductor substrate, the second substrate voltage being different from the first substrate voltage;
obtaining a second output indicative of the sensed quantity from the sensing arrangement while the second substrate voltage is applied to the body of the semiconductor substrate; and
identifying a charge on a surface of the semiconductor substrate when a difference between the first output and the second output is greater than a threshold amount.

12. The method of claim 11, further comprising calibrating the sensing arrangement when the difference between the first output and the second output is less than the threshold amount.

13. The method of claim 11, further comprising taking remedial action in response to identifying the charge on the surface of the semiconductor substrate.

14. The method of claim 11, further comprising generating an interrupt signal in response to identifying the charge on the surface of the semiconductor substrate.

15. The method of claim 11, wherein:
the sensing arrangement comprises a plurality of piezoresistive elements formed on the semiconductor substrate;
obtaining the first output comprises obtaining a first output voltage from the plurality of piezoresistive elements; and
obtaining the second output comprises obtaining a second output voltage from the plurality of piezoresistive elements.

16. The method of claim 15, further comprising calibrating the sensing arrangement when the difference between the first output voltage and the second output voltage is less than the threshold amount.

17. The method of claim 16, wherein calibrating the sensing arrangement comprises:
applying a bias voltage to the semiconductor substrate;

obtaining a third output voltage from the plurality of piezoresistive elements while the bias voltage is applied to the semiconductor substrate; and determining a factor for converting a subsequent output voltage from the plurality of piezoresistive elements to a corresponding sensed metric value based on the third output voltage.

18. A method for operating a sensing device, the sensing device including a sensing arrangement formed on a semiconductor substrate, the method comprising:

applying a plurality of substrate voltages to a body of the semiconductor substrate, each substrate voltage of the plurality of substrate voltages being applied to the body of the semiconductor substrate at a different time, wherein a respective output signal indicative of a sensed quantity is obtained from the sensing arrangement for each substrate voltage of the plurality of substrate voltages while the respective substrate voltage is applied to the body of the semiconductor substrate, resulting in a plurality of output signals; and detecting a surface charge condition based upon a difference among the plurality of output signals.

19. The method of claim 18, wherein:

applying the plurality of substrate voltages comprises:

applying an initial substrate voltage to the body of the semiconductor substrate, the plurality of output signals including an initial output voltage obtained from the sensing arrangement while the initial substrate voltage is applied to the body of the semiconductor substrate; and applying a second substrate voltage to the body of the semiconductor substrate, the plurality of output signals including a second output voltage obtained from the sensing arrangement while the second substrate voltage is applied to the body of the semiconductor substrate; and detecting the surface charge condition comprises identifying when a difference between the second output voltage and the initial output voltage exceeds a threshold amount.

20. The method of claim 18, the sensing arrangement comprising a plurality of piezoresistive elements formed on a diaphragm region of the semiconductor substrate, the plurality of piezoresistive elements being configured to generate a voltage output indicative of pressure applied to the sensing device, wherein the method further comprises:

obtaining an initial measured voltage output from the plurality of piezoresistive elements when the a first substrate voltage of the plurality of substrate voltages is applied to the body of the semiconductor substrate; and obtaining a second measured voltage output from the plurality of piezoresistive elements when a second substrate voltage of the plurality of substrate voltages is applied to the body of the semiconductor substrate, the surface charge condition being detected when a difference between the second measured voltage output and the initial measured voltage output exceeds a threshold amount.

* * * * *